US011893173B2

(12) United States Patent
Aoki et al.

(10) Patent No.: US 11,893,173 B2
(45) Date of Patent: Feb. 6, 2024

(54) ELECTRONIC PEN

(71) Applicant: Wacom Co., Ltd., Saitama (JP)

(72) Inventors: Shinya Aoki, Saitama (JP); Yoshiyuki Hashimoto, Saitama (JP); Takenori Kaneda, Saitama (JP)

(73) Assignee: Wacom Co., Ltd., Saitama (JP)

( * ) Notice: Subject to any disclaimer, the term of this patent is extended or adjusted under 35 U.S.C. 154(b) by 0 days.

(21) Appl. No.: 17/725,225

(22) Filed: Apr. 20, 2022

(65) Prior Publication Data

US 2022/0244798 A1    Aug. 4, 2022

Related U.S. Application Data

(63) Continuation of application No. PCT/JP2020/040160, filed on Oct. 27, 2020.

(30) Foreign Application Priority Data

Nov. 8, 2019  (JP) ................................. 2019-203411

(51) Int. Cl.
*G06F 3/046*        (2006.01)
*G06F 3/0354*       (2013.01)
(Continued)

(52) U.S. Cl.
CPC ........ *G06F 3/03545* (2013.01); *G06F 3/0346* (2013.01); *G06F 3/0383* (2013.01);
(Continued)

(58) Field of Classification Search
CPC .. G06F 3/03545; G06F 3/0346; G06F 3/0383; G06F 3/0446; G06F 3/046;
(Continued)

(56) References Cited

U.S. PATENT DOCUMENTS

2006/0028458 A1*  2/2006 King .................... G02B 27/017
                                                                345/179
2008/0180411 A1*  7/2008 Solomon ............. G06F 3/03545
                                                                345/179
(Continued)

FOREIGN PATENT DOCUMENTS

JP        2019-114212 A        7/2019

OTHER PUBLICATIONS

International Search Report, dated Jan. 12, 2021, for International Application No. PCT/JP2020/040160, 5 pages (with English-language translation).

*Primary Examiner* — Lunyi Lao
*Assistant Examiner* — Jarurat Suteerawongsa
(74) *Attorney, Agent, or Firm* — Seed IP Law Group LLP (57) ABSTRACT

Provided is an electronic pen including an electronic pen body portion, an electronic pen housing being a cylindrical body housing the electronic pen body portion, a connector portion including a connector substrate, and a terminal portion including a base portion raised from the connector substrate in a direction crossing an axial direction and a contact portion extended to a back end side from a position separated from the connector substrate on a back end surface of the base portion, and a connector housing being a cylindrical body housing the connector portion and connected to a back end side of the electronic pen housing. A cross section of the connector housing in a direction orthogonal to the axial direction is substantially triangular. An axial center of the connector substrate coincides with an axial center of the electronic pen body portion when the connector housing is attached to the electronic pen housing.

12 Claims, 8 Drawing Sheets

(51) Int. Cl.
  *G06F 3/0346* (2013.01)
  *G06F 3/038* (2013.01)
  *H01R 13/52* (2006.01)
  *H01R 13/6581* (2011.01)
  *H01R 13/6594* (2011.01)
  *H05K 5/00* (2006.01)

(52) U.S. Cl.
  CPC ..... *H01R 13/5213* (2013.01); *H01R 13/6581* (2013.01); *H01R 13/6594* (2013.01); *H05K 5/0039* (2013.01)

(58) Field of Classification Search
  CPC ............ H01R 13/5213; H01R 13/6581; H01R 13/6594; H05K 5/0039
  See application file for complete search history.

(56) References Cited

U.S. PATENT DOCUMENTS

| | | | |
|---|---|---|---|
| 2015/0378456 A1* | 12/2015 | Ho | G06F 3/03545 345/174 |
| 2016/0109967 A1* | 4/2016 | Craig | G06F 3/016 345/179 |
| 2017/0068341 A1* | 3/2017 | Zimmerman | G06F 3/0416 |
| 2019/0196608 A1 | 6/2019 | Onoda et al. | |
| 2019/0278389 A1* | 9/2019 | Yang | G06F 3/03545 |
| 2020/0033964 A1* | 1/2020 | Aoki | G06F 3/03545 |

\* cited by examiner

| SIGNAL RECEPTION MODE | SIGNAL TRANSMISSION MODE | | | |
|---|---|---|---|---|
| | ←Ta→ | ←Tb→ | ←Ta→ | ←Tb→ |

FIG.7B

| | POSITION DETECTION PERIOD | TILT DETECTION PERIOD | POSITION DETECTION PERIOD | TILT DETECTION PERIOD |
|---|---|---|---|---|

| SW1 | OFF | ON | OFF | ON | OFF |

| TERMINAL R | TERMINAL G | TERMINAL S | TERMINAL G | TERMINAL S |

ELECTRONIC PEN

BACKGROUND

Technical Field

This disclosure relates to an electronic pen for inputting information through a position detection apparatus.

Description of the Related Art

A battery-powered electronic pen is used to transmit a signal to a sensor unit of a position detection apparatus. When a rechargeable battery is mounted on the electronic pen, a connector for charging the rechargeable battery needs to be provided. In recent years, data or a program may need to be transmitted and received between the electronic pen and an external device such as a personal computer, to increase the functionality of the electronic pen, and a connector for transmitting and receiving data may need to be provided.

To handle such a case, an invention related to an electronic pen is disclosed in Japanese Patent Laid-Open No. 2019-114212 (hereinafter referred to as "Patent Document 1"), the electronic pen including a connector arranged on a back end side of a cylindrical housing of the electronic pen to allow inserting and removing a plug of universal serial bus (USB) standard from a back end surface. In the invention described in Patent Document 1, the connector of USB standard is provided around the diameter of a circular back end surface of the electronic pen. The connector portion does not interfere with the use of the electronic pen, and the plug can be appropriately inserted and removed.

In general, a connector portion includes a housing including a contact portion provided with a plurality of terminals, and a base portion that holds the contact portion in a hollow state, and the housing is covered by a metal shell portion, as also disclosed in Patent Document 1. The shell portion provides an outer wall of the connector portion. The shell portion is a member that surely holds and protects the housing and that sets the position when the plug is fitted. It is difficult to miniaturize the electronic pen when the connector portion including the housing and the shell portion is mounted on the electronic pen.

Figure 1:
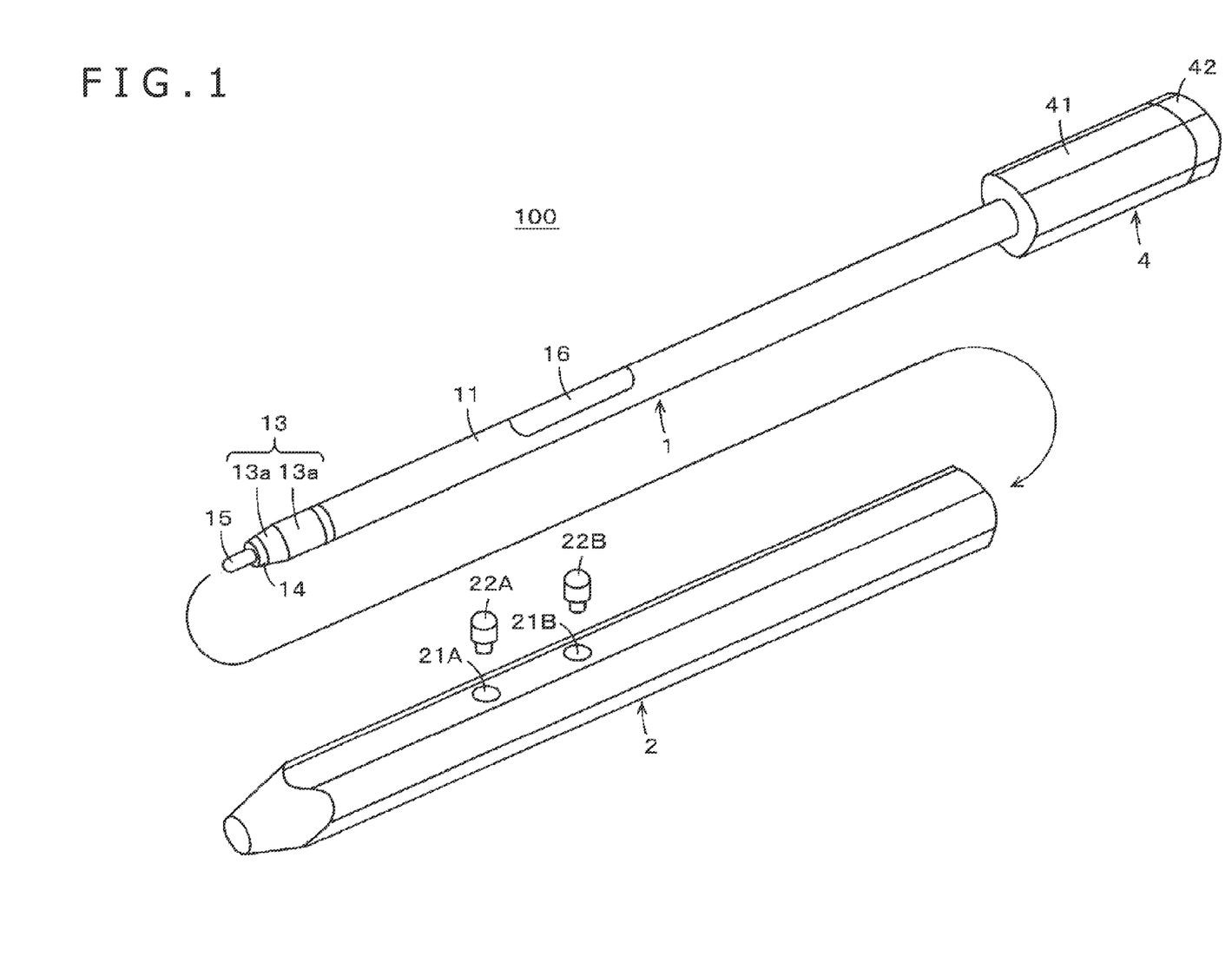
FIG. 1 is an exploded perspective view for describing an overall configuration of an electronic pen according to an embodiment of the present disclosure.

As also illustrated in FIG. 1 of Patent Document 1, a core body part is also provided at a position deviated from the axial center of a circuit board in order to provide the connector portion on the circuit board. Therefore, not only the configuration of the connector part, but also the configuration of the connection part of the pen tip side and the circuit board may become complicated. In this case, the axial center of the electronic pen and the axial center of the circuit board do not coincide with each other, and the load imposed on the circuit board may be increased by the pen pressure applied to the core body or the pressure applied when the plug is attached to the connector portion.

BRIEF SUMMARY

In view of the above, an object of the disclosure is to provide an electronic pen without a complicated configuration even when a connector portion is provided, the electronic pen strong enough to withstand the pen pressure or the load applied when a plug is inserted or removed, the electronic pen also realizing miniaturization.

To solve the problem, provided is an electronic pen including an electronic pen body portion, an electronic pen housing that is a cylindrical body that houses the electronic pen body portion, a connector portion including a connector substrate, and a terminal portion including a base portion raised from the connector substrate in a direction crossing an axial direction of the connector substrate and a contact portion extended to a back end side of the connector substrate from a position separated from the connector substrate on a back end surface of the base portion, and a connector housing which is a cylindrical body that houses the connector portion and that is connected to a back end side of the electronic pen housing, in which a cross section of the connector housing in a direction orthogonal to the axial direction is substantially triangular, in which an axial center of the connector substrate coincides with an axial center of the electronic pen body portion when the connector housing in which the connector portion is housed is attached to the electronic pen housing in which the electronic pen body portion is housed.

According to the electronic pen, the electronic pen housing and the connector housing are connected to each other. Although the electronic pen housing and the connector housing are both cylindrical bodies, the cross section of at least the connector housing in the direction orthogonal to the axial direction is substantially triangular. The electronic pen body portion is housed in the electronic pen housing, and the connector portion, which includes: the connector substrate; and the terminal portion including the base portion raised from the connector substrate and the contact portion extended from the position separated from the connector substrate on the back end surface of the base portion, is housed in the connector housing. Therefore, the contact portion of the terminal portion is formed at a position eccentric to the axial center of the connector substrate.

In this way, the contact portion of the terminal portion can be formed in a region on the bottom side of the substantially triangular cross section in the direction orthogonal to the axial direction of the connector housing. In addition, the axial center of the connector substrate coincides with the axial center of the electronic pen body portion when the connector housing is attached to the electronic pen housing. According to the configuration, important configuration parts of the electronic pen can be arranged on the axial center of the electronic pen body portion as in a case of a conventional electronic pen. This can provide an electronic pen without a complicated configuration compared to a conventional electronic pen even when a connector portion is provided, the electronic pen strong enough to withstand the load caused by the pen pressure or the load applied when a plug is inserted or removed, the electronic pen also realizing miniaturization.

DETAILED DESCRIPTION

An embodiment of an electronic pen of the disclosure will now be described with reference to the drawings. In recent years, an input device including a position detection apparatus and an electronic pen is used in an electronic device, such as a pen tablet, a smartphone, and a tablet personal computer (PC), for graphic design. This allows to input a detailed drawing or a character to the electronic device as in a case of writing on paper with a pen. There are various position detection systems for the electronic pen and the position detection apparatus, and examples of typical systems include an electromagnetic resonance system and a capacitance system.

In the electromagnetic resonance system, the position detection apparatus includes a sensor unit including a plurality of loop coils arranged in the X-axis direction and the Y-axis direction. A transmission period for sequentially supplying power to the plurality of loop coils of the sensor unit to generate a magnetic field and a reception period for stopping the supply of power to receive a magnetic field from the outside are alternately provided. The corresponding electronic pen includes a resonant circuit including a coil and a capacitor. The electronic pen generates a signal when current flows through the coil in response to the magnetic field from the sensor unit. The electronic pen includes pen pressure information in the signal and transmits the signal to the position detection sensor. The position detection apparatus receives the signal in the reception period to detect the instructed position and the pen pressure of the electronic pen.

In the capacitance system, the position detection apparatus includes a sensor unit including a plurality of linear conductors (line electrodes) arranged in the X-axis direction and the Y-axis direction. The sensor unit detects the instructed position according to the change in capacitance (charge) occurred in the linear conductors when a finger or a capacitive pen approaches the sensor unit. Note that examples of the types of capacitive pen include a conductive pen-type position indicator and what is called active capacitive pen driven by a battery to transmit a signal. In a case of an active capacitance system with an active capacitive pen, the electronic pen includes the pen pressure information in a signal from an oscillation circuit mounted on the electronic pen and transmits the signal. The position detection apparatus receives the signal to detect the instructed position and the pen pressure.

The electronic pen of the disclosure in this application can be applied to various types of electronic pens. Therefore, the electronic pen of the disclosure in this application can be applied also to the electronic pen of the electromagnetic resonance system and the electronic pen of the active capacitance system (active capacitive pen) described above. For clear description, an example of applying the electronic pen of the disclosure to the electronic pen of the active capacitance system (AES system) will be described in the embodiment.

Overall Configuration of Electronic Pen 100

FIG. 1 is an exploded perspective view for describing an overall configuration of an electronic pen 100 according to the embodiment. As illustrated in FIG. 1, the electronic pen 100 of the embodiment includes an electronic pen body portion 1 and an electronic pen housing 2 which is a cylindrical body that houses the electronic pen body portion 1, in which the cross section of the electronic pen housing 2 in a direction orthogonal to an axial direction is substantially triangular. A connector housing 4 which is a cylindrical body that houses a connector portion (described later) and that is connected to the back end side of the electronic pen housing 2 is further provided at a back end of the electronic pen body portion 1, and the cross section of the connector housing 4 in the direction orthogonal to the axial direction matches the cross section of the electronic pen housing 2. That is, the connector housing 4 has the same substantially triangular cross section as the cross section of the electronic pen housing 2. Therefore, when the connector housing 4 is connected to the electronic pen housing 2, one electronic pen 100 can be provided without a difference in level between the housings.

The electronic pen body portion 1 includes a pipe portion 11 formed from, for example, a metal material. Main parts, such as a circuit board provided with an electronic circuit and a core body as a center electrode described in detail later, for realizing the electronic pen function are housed in the pipe portion 11. A cylindrical peripheral electrode 13 formed from a conductive material, such as metal, is coupled to the pen tip (front end) side of the pipe portion 11 through a ring-shaped coupling member 12 formed from a resin material (insulating material), such as plastic.

Two parts are integrated to form the peripheral electrode 13, the two parts including a cylindrical portion 13b with the same outer diameter as the pipe portion 11, and a tapered portion 13a becoming narrower toward the tip. A ring-shaped front cap 14 formed from a resin material (insulating material), such as plastic, is provided at a tip portion of the peripheral electrode 13. A tip part of a core body (center electrode) 15 formed from a conductive material, such as a conductive polyacetal resin, protrudes from an opening of the front cap 14 to provide a pen tip. A side switch portion 16 including two side switches in the embodiment is provided on a side surface of the pipe portion 11 of the electronic pen body portion 1.

The electronic pen housing 2 that houses the electronic pen body portion 1 is formed from a resin material, such as plastic, and is pipe-shaped. The electronic pen housing 2 has a shape (tapered shape) becoming narrower toward the pen tip (front end). Note that the electronic pen housing 2 can also be formed from a non-conductive material other than the resin, such as wood, for example. Holes 21A and 21B for side switch are provided on a side surface of the electronic pen housing 2. The holes 21A and 21B are provided at positions corresponding to the two side switches in the side switch portion 16 of the electronic pen body portion 1 housed in the electronic pen housing 2.

Operation buttons 22A and 22B formed from a resin, such as plastic, for example, are fitted into the holes 21A and 21B for side switch. The operation buttons 22A and 22B are pushed into the electronic pen housing 2 when pressed, and the operation buttons 22A and 22B return to the positions before the press when the pressing force is released. In this way, the side switches provided on the electronic pen body portion 1 can be pressed through the operation buttons 22A and 22B. Note that the side switches in the electronic pen are equivalent to what is generally called a left click button and a right click button of a mouse that is a pointing device of a personal computer. Therefore, the side switches can be operated to, for example, display a window menu to select a target item in an electronic device such as a pen tablet provided with a position detection apparatus.

The connector housing 4 provided on the back end side of the electronic pen body portion 1 includes a body portion 41 formed from a resin material, such as plastic, and an end cap 42 formed from a metal material, for example. The shapes of the cross sections of the body portion 41 and the end cap 42 are the same, and as illustrated in FIG. 1, there is no difference in level when the body portion 41 and the end cap 42 are connected. The inside of the connector housing 4 with such an appearance is hollow, and the connector portion described later is mounted.

Figure 2A:
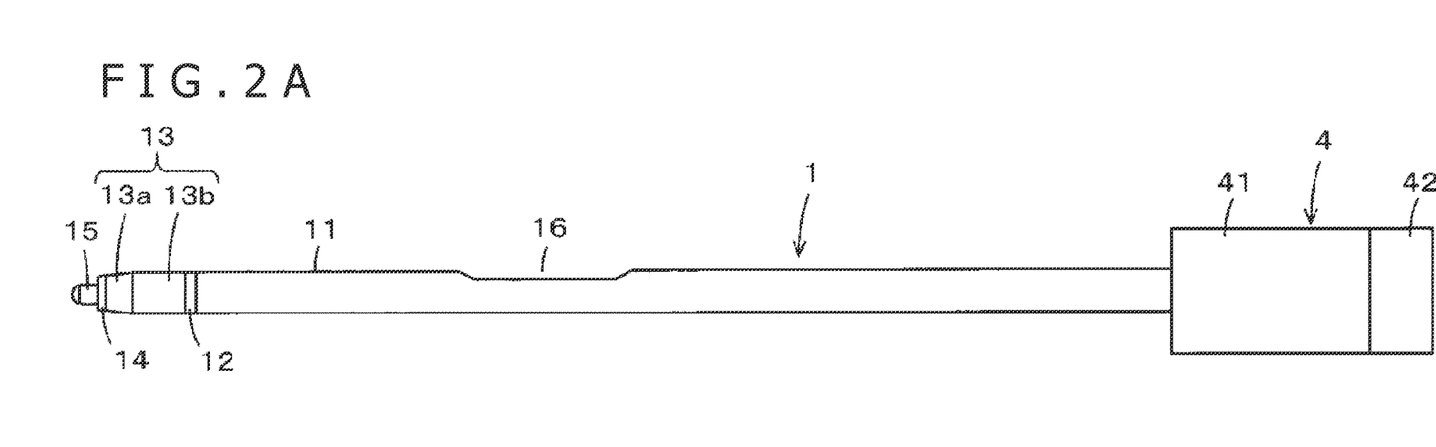
FIGS. 2A and 2B are diagrams for describing an electronic pen body portion and a connector portion of the electronic pen according to an embodiment of the present disclosure.
Figure 2B:
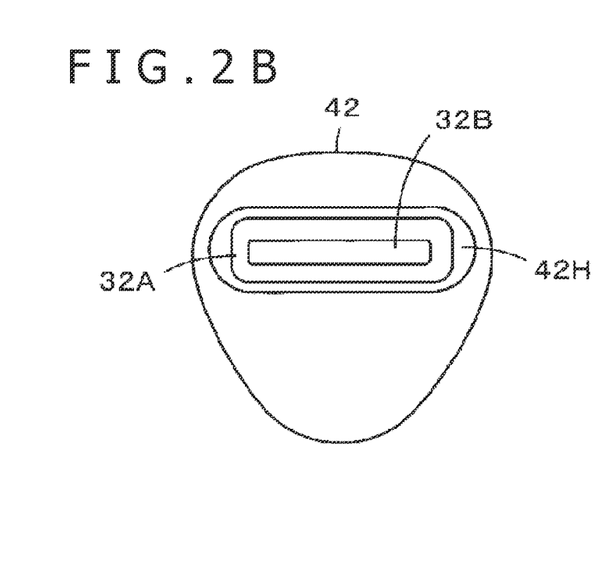

FIGS. 2A and 2B are diagrams for describing the appearance of the electronic pen body portion 1 and the connector housing 4 of the electronic pen according to the embodiment. As illustrated in FIG. 2A, the electronic pen body portion 1 and the connector housing 4 are connected to each other. Specifically, the circuit board mounted on the pipe portion 11 of the electronic pen body portion 1 and the connector substrate, described later, mounted on the connector housing 4 are electrically connected, and they are further fixed to each other. There can be various methods for the connection in this case. For example, a jack (reception portion) type connection portion can be provided at a back end portion of the circuit board mounted on the pipe portion 11 of the electronic pen body portion 1, and a plug (insertion portion) type connection portion can be provided at a front end portion of the connector substrate mounted on the connector housing 4. In this way, the electronic pen body portion 1 and the connector housing 4 can be connected to electrically connect them, and they can also be physically fixed.

An opening portion 42H for inserting and removing a corresponding plug to and from a contact portion of the connector portion mounted on the connector housing 4 is provided on the back end surface of the end cap 42 at the back end portion of the connector housing 4 as illustrated in FIG. 2B. FIG. 2B illustrates a state in which a base portion 32A and a contact portion 32B included in a terminal portion of the connector portion mounted on the connector housing 4 can be viewed through the opening portion 42H.

Configuration Example of Connector Portion

Figure 3A:
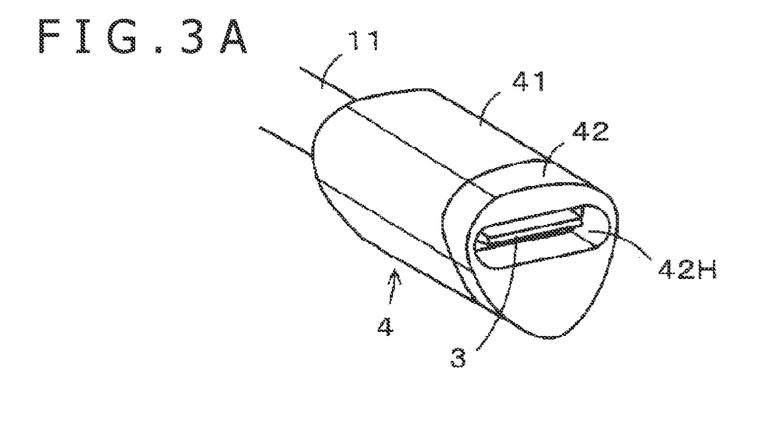
FIGS. 3A to 3C are diagrams for describing the connector portion of the electronic pen according to an embodiment of the present disclosure.
Figure 3B:
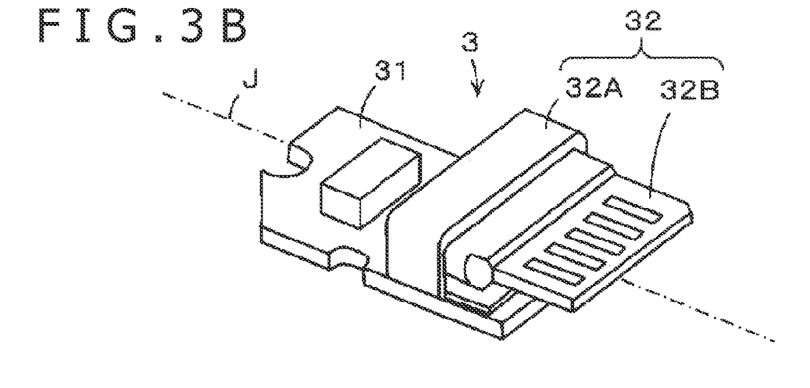
Figure 3C:
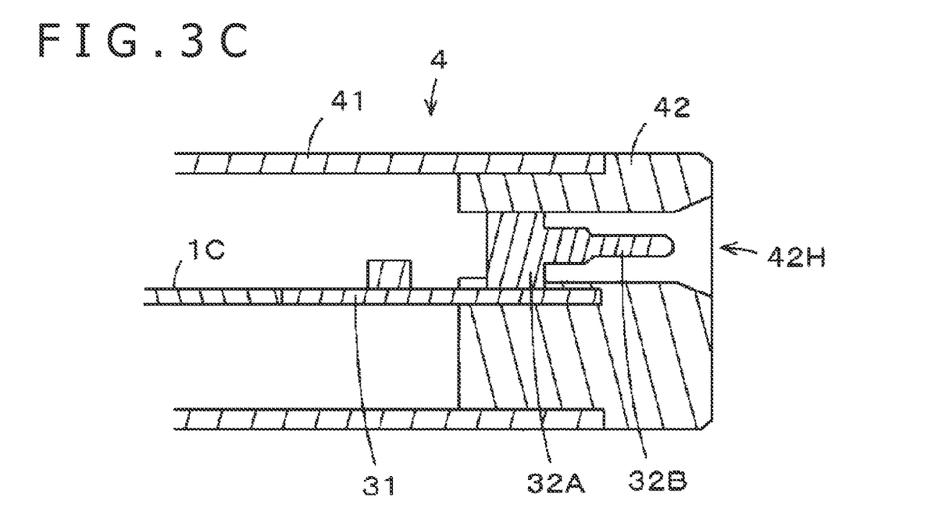

FIGS. 3A to 3C are diagrams for describing details of the connector portion of the electronic pen according to the embodiment. FIG. 3A is a perspective view of the connector housing 4 part as viewed from the back end surface side. The shape of the cross section of the connector housing 4 including the body portion 41 and the end cap 42 in the direction crossing the axial direction is substantially triangular as indicated by the back end surface of the end cap 42, and the opening portion 42H for inserting and removing the plug is provided on the back end surface. A connector portion 3 is mounted in the back of the opening portion 42H.

That is, the connector housing 4 includes a jack portion (reception portion) where a connector plug (insertion portion) is inserted.

The connector portion 3 includes a connector substrate 31 and a terminal portion 32 as illustrated in a perspective view of the connector portion in FIG. 3B. The terminal portion 32 includes the base portion 32A raised in a direction crossing an axial direction J on the back end side of the connector substrate 31, and the contact portion 32B extended to the back end side along the axial direction J from a position separated from the connector substrate on the back end surface of the base portion 32A. In this way, the terminal portion 32 includes the base portion 32A and the contact portion 32B, and the contact portion 32B is located at a position eccentric to the axial center of the connector substrate 31.

That is, the connector portion 3 including the connector substrate 31 and the terminal portion 32 is inserted and fixed to the end cap 42 part of the connector housing 4 as illustrated in a cross-sectional view of the connector housing 4 part provided with the connector portion 3 in FIG. 3C. In this case, the contact portion 32B is positioned at a center part of the opening portion 42H. The end cap 42 is formed from a metal material and realizes a function of a shell portion of the connector portion 3. That is, the end cap 42 provides an outer wall of the connector portion 3. The end cap 42 can surely hold and protect the connector portion 3 and regulate the position when the plug is fitted. The end cap 42 formed from a metal material also has a function of preventing external noise from entering. In this way, the connector housing 4 and the connector portion 3 provide the connector of the electronic pen 100.

Note that a front end portion of the connector substrate 31 of the connector portion 3 and a back end portion of a circuit board 1C mounted on the pipe portion 11 of the electronic pen body portion 1 are connected in the state illustrated in FIG. 3C, and the positional relation between the electronic pen body portion 1 and the connector portion 3 is important.

Positional Relation Between Electronic Pen Body Portion and Connector Portion

Figure 4A:
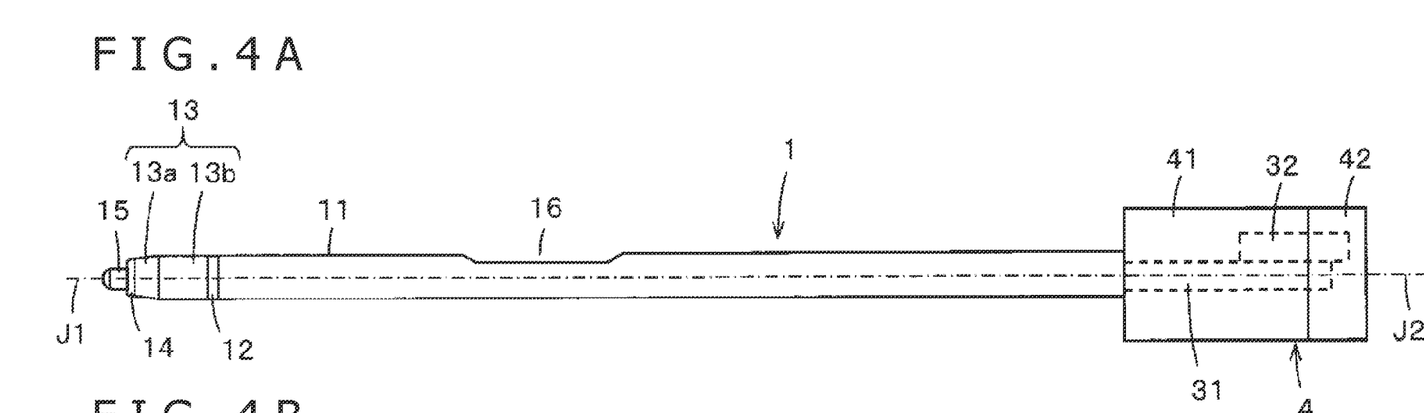
FIGS. 4A and 4B are diagrams for describing a positional relation between the electronic pen body portion and the connector portion of the electronic pen according to an embodiment of the present disclosure.
Figure 4B:
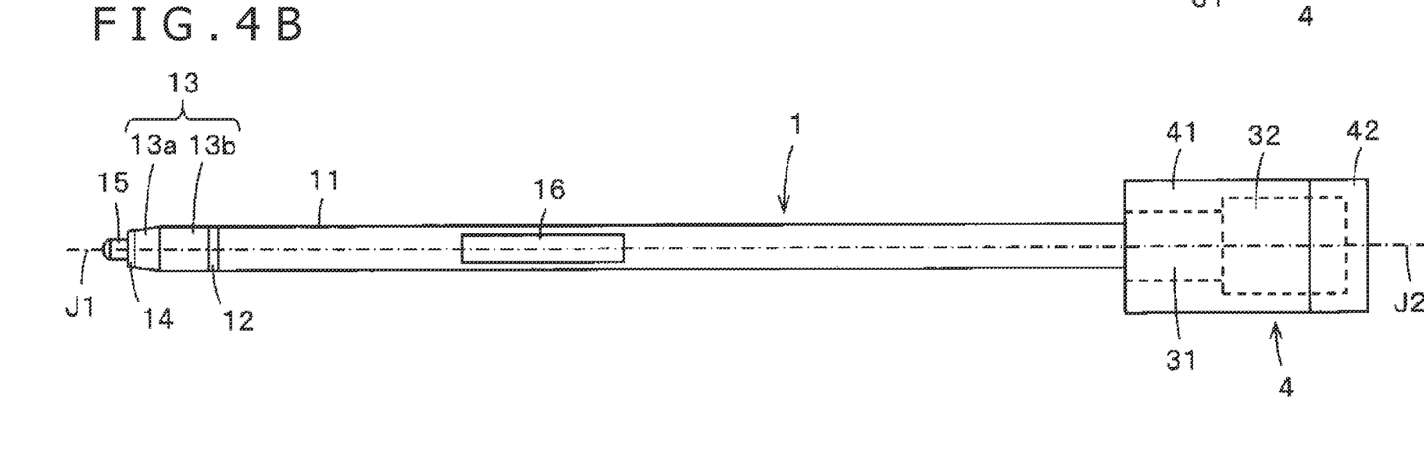

FIGS. 4A and 4B are diagrams for describing the positional relation between the electronic pen body portion 1 and the connector portion 3 of the electronic pen 100 according to the embodiment. FIG. 4A is a diagram of the side switch portion 16 provided on the electronic pen body portion 1 as viewed from a side direction, and FIG. 4B is a diagram of the side switch portion 16 provided on the electronic pen body portion 1 as viewed from an upper direction. The electronic pen body portion 1 and the connector portion 3 provided in the connector housing 4 are connected in the case illustrated in FIGS. 4A and 4B. That is, the circuit board mounted on the electronic pen body portion 1 and the connector substrate 31 mounted on the connector housing 4 are connected in the state illustrated in FIGS. 4A and 4B.

As can be understood from FIGS. 4A and 4B, an axial center J1 of the electronic pen body portion 1 and an axial center J2 of the connector substrate 31 of the connector portion 3 mounted on the connector housing 4 coincide with each other when viewed from any direction. In the embodiment, an axial center of the circuit board 1C mounted on the pipe portion 11 of the electronic pen body portion 1 coincides with the axial center J1 of the electronic pen body portion 1, although not illustrated. In this way, the axial center J2 of the connector substrate 31 coincides with the axial center J1 of the electronic pen body portion 1 when the connector housing 4 provided with the connector portion 3 is connected (attached) to the electronic pen housing 2 provided with the electronic pen body portion 1.

Therefore, the axial center of the electronic pen 100 goes through the axial center of the electronic pen body portion 1 and goes through the axial center of the connector substrate 31, from the front end (pen tip) of the core body 15 to the back end surface of the end cap 42 in the electronic pen 100 according to the embodiment. In this way, even when the pen pressure is applied to the tip of the core body 15 or even when the plug is pushed into the connector portion 3 from the outside, the applied pressure can be received through the axial center, and excessive pressure is not applied to only a part of the electronic pen 100. This can provide an electronic pen that can withstand the pressure applied to the back end side from the pen tip direction and withstand the pressure applied to the pen tip side from the back end side. In other words, an electronic pen can be provided that is highly resistant to the pressure applied to the back end side from the pen tip direction and the pressure applied to the pen tip side from the back end side.

As illustrated in FIG. 4B, the width of the connector substrate 31 is equal to or smaller than the width of the terminal portion 32 (part including the base portion 32A and the contact portion 32B). This can prevent inhibition of the miniaturization of the electronic pen 100. That is, when the width of the connector substrate 31 is the same as or shorter than the width of the terminal portion 32, the area of the cross section of the connector housing 4 does not have to be increased under the influence of the connector substrate 31.

Specific Example of Connector Portion

Note that the connector portion 3 of the embodiment corresponds to, for example, type C of USB standard. The connector portion 3 is obviously not limited to this, and for example, connectors of various types of USB standard can be used for the connector portion 3 provided on the electronic pen 100 according to the embodiment. In the case of the embodiment, the end cap 42 of the connector housing 4 can be used as a shell portion as described above. There is no need to separately provide a shell portion that covers the contact portion, and this realizes miniaturization of the electronic pen.

The connector portion 3 of the embodiment is not limited to the connector portion of USB standard. The connector portion 3 can correspond to connectors of various standards other than the USB standard. For example, the connector portion may be configured to correspond to a connector including only a power supply terminal for charging. The connector portion may also be configured to correspond to a connector including only a terminal for transmitting and receiving data.

External Shape of Electronic Pen 100

Figure 5:
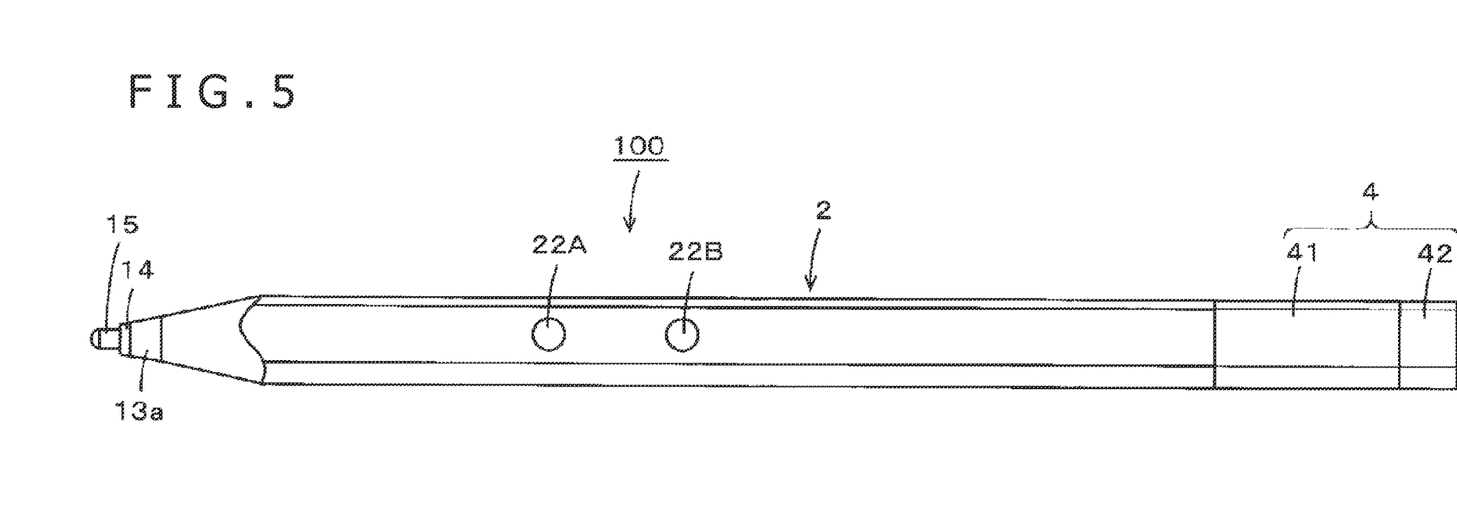
FIG. 5 is a diagram for describing an appearance of the electronic pen according to an embodiment of the present disclosure.

FIG. 5 is a diagram for describing an appearance of the electronic pen according to the embodiment. As illustrated in FIG. 5, the electronic pen 100 of the embodiment has an appearance similar to what is generally called pencil. In this case, the connector housing 4 is connected to the back end of the electronic pen housing 2 to realize a connector connection function. The tapered portion 13a of the peripheral electrode 13 of the electronic pen body portion 1, the front cap 14, and the tip part of the core body 15 protrude from the tip of the electronic pen housing 2 to realize an electronic pen function of AES system.

The full length (length in longitudinal direction) of the electronic pen 100 according to the embodiment is, for example, approximately 13 cm to 16 cm, which is approximately the same as or slightly shorter than commercially available ball point pens and mechanical pencils. The cross section of the connector housing 4 is substantially triangular with the apices of an equilateral triangle formed into round shapes as illustrated in FIGS. 2B and 3A, and the length of one side is approximately 10 mm. Therefore, the end cap 42 provides a shell portion as described above, and the connector housing 4 can be provided with a connector portion corresponding to type C of USB standard in which the width of the shell portion is 9 mm. Note that the diameter of the pipe portion 11 of the electronic pen body portion 1 is, for example, approximately 4 mm to 6 mm. The sizes illustrated here are obviously examples, and the parts can be adjusted to various sizes.

Figure 6:
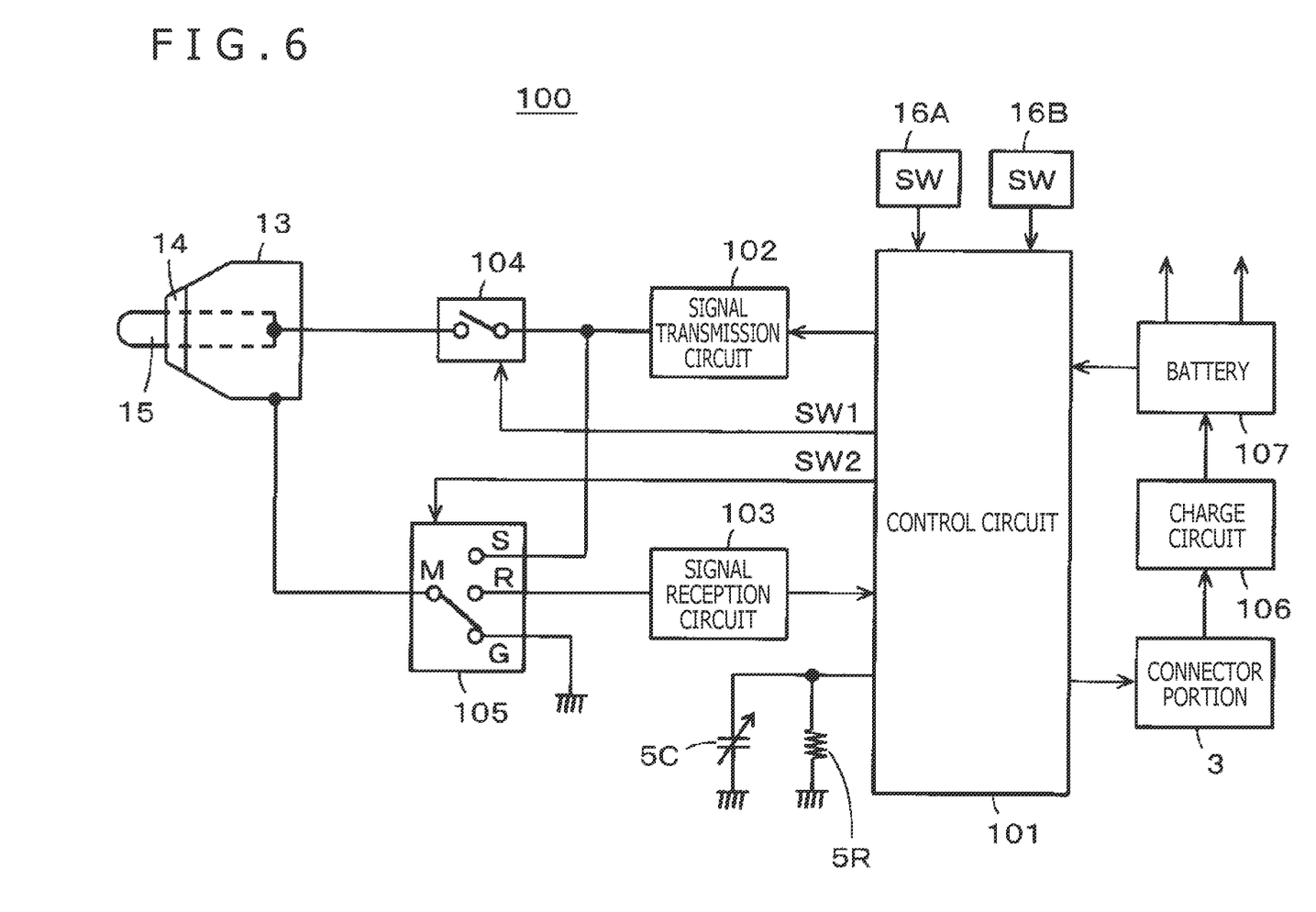
FIG. 6 is a diagram for describing a configuration example of electronic circuit parts that realize an electronic pen function of the electronic pen according to an embodiment of the present disclosure.

Configuration Example of Electronic Circuit Parts Realizing Electronic Pen Function FIG. 6 is a diagram for describing a configuration example of electronic circuit parts realizing the electronic pen function of the electronic pen 100. A control circuit 101, a signal transmission circuit 102, a signal reception circuit 103, a switch circuit 104, a selector circuit 105, a charge circuit 106, and a battery 107 illustrated in FIG. 6 are circuit parts included in the circuit board 1C mounted on the pipe portion 11 of the electronic pen body portion 1. The control circuit 101 is realized by an integrated circuit (IC) mounted on the circuit board 1C. Switches (SW in FIG. 6) 16A and 16B provide side switches arranged on the side switch portion 16. The switches 16A and 16B are pressed and operated through the operation buttons 22A and 22B, and the operation state is reported to the control circuit 101.

The signal transmission circuit 102 and the signal reception circuit 103 are connected to the control circuit 101, and a variable capacitor 5C as a pen pressure detection unit is also connected to the control circuit 101. The variable capacitor 5C is pressed by the core body 15, and the capacitance, that is, the capacitance of the positive electrode and the negative electrode, can be changed according to the pressing force. A resistance 5R is connected in parallel to the variable capacitor 5C.

A signal output end of the signal transmission circuit 102 is connected to the core body 15 through the switch circuit 104. In the example, the signal output end of the signal transmission circuit 102 is connected to a terminal S of the selector circuit 105. A movable terminal M of the selector circuit 105 is connected to the peripheral electrode 13. A terminal R of the selector circuit 105 is connected to an input end of the signal reception circuit 103. A terminal G of the selector circuit 105 is connected to an earth electrode (ground electrode).

The control circuit 101 supplies the switch circuit 104 with a control signal SW1 for on/off control of the switch circuit 104. The control circuit 101 supplies the selector circuit 105 with a switch control signal SW2 indicating which one of the terminal S, the terminal R, and the terminal G the movable terminal M is to be connected.

Note that the voltage of the battery 107 is supplied as a power supply voltage to each of the control circuit 101, the signal transmission circuit 102, the signal reception circuit 103, the switch circuit 104, and the selector circuit 105. The battery 107 can be charged with a charge voltage formed by the charge circuit 106 from external power supplied from the outside through the connector portion 3 described above.

The signal reception circuit 103 receives a signal received by the peripheral electrode 13 through capacitive coupling (electric field coupling) with the position detection sensor of the position detection apparatus. The signal reception circuit 103 performs a process, such as demodulation, according to the received signal and transmits a signal of the processing result to the control circuit 101.

The control circuit 101 analyzes the signal from the signal reception circuit 103 to determine the specifications of the position detection apparatus of the partner and to set the timing of interaction of signal with the position detection sensor of the position detection apparatus of the partner. The control circuit 101 controls the format of the signal to be output from the signal transmission circuit 102 to meet the specifications of the position detection apparatus of the partner and interacts with the position detection sensor at the set timing.

The signal transmission circuit 102 basically outputs, under the control of the control circuit 101, a position detection signal (burst signal) with a predetermined frequency for position detection in the position detection apparatus and a signal including pen pressure information corresponding to the pen pressure detected by the variable capacitor 5C. The signal transmission circuit 102 also outputs a signal for detection of a tilt angle of the electronic pen 100. That is, the signal transmission circuit 102 transmits burst signals for the position detection and for the detection of the tilt angle of the electronic pen 100 under the control of the control circuit 101.

The control circuit 101 performs an operation of detecting the pen pressure based on the capacitance of the variable capacitor 5C included in the pen pressure detection unit while the signal transmission circuit 102 transmits the burst signal for position detection. In the example, the control circuit 101 first charges the variable capacitor 5C to the full charge state and then stops the charge to put the variable capacitor 5C into a state of releasing the charge through the resistance 5R. The control circuit 101 measures the time from the start of the discharge to the point that the voltage across the variable capacitor 5C becomes a predetermined voltage and uses the time to detect the capacitance of the variable capacitor 5C at that point. The capacitance of the variable capacitor 5C corresponds to the pen pressure applied to the core body 15 at that point, and the control circuit 101 detects the pen pressure based on the detected capacitance.

The control circuit 101 converts the detected pen pressure into a digital signal of a plurality of bits in the example and controls the signal transmission circuit 102 to output, from the signal transmission circuit 102, the pen pressure information corresponding to the digital signal.

Figure 7A:
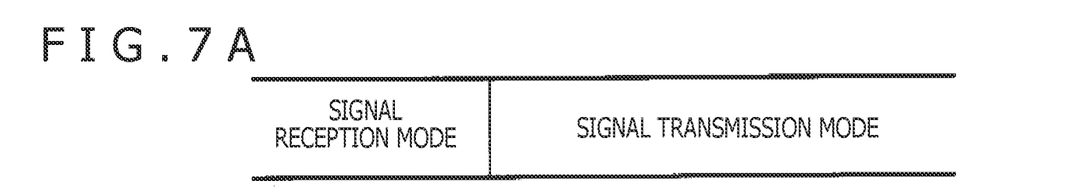
FIGS. 7A to 7D are diagrams used for describing an operation of the configuration example of the electronic circuit parts of the electronic pen according to an embodiment of the present disclosure.

FIGS. 7A to 7D are diagrams used for describing the operation in the configuration example of the electronic circuit parts of the electronic pen 100. In the embodiment, the control circuit 101 in a steady state puts the electronic pen body portion 1 into a signal reception mode for receiving a signal from the position detection sensor of the position detection apparatus as illustrated in FIG. 7A. In the signal reception mode, the reception of the signal from the position detection apparatus is checked, and after the predetermined process, the signal reception mode is switched to a signal transmission mode for transmitting the signal to the position detection apparatus.

Figure 7B:
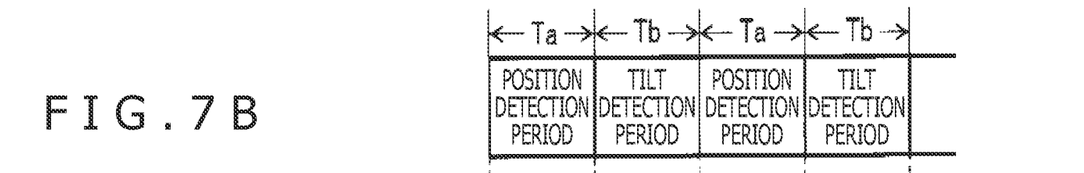
Figures 7C, 7D:
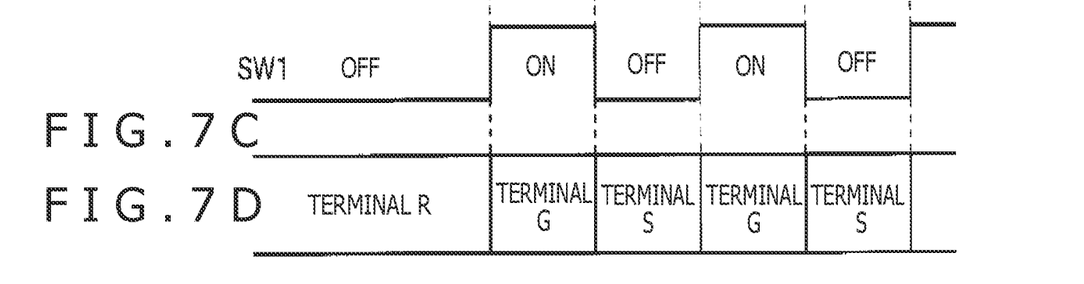

In the embodiment, the control signal SW1 (see FIG. 7C) from the control circuit 101 turns off the switch circuit 104 in the signal reception mode, and the switch control signal SW2 controls the selector circuit 105 to connect the movable terminal M to the terminal R (see FIG. 7D).

Therefore, the signal from the position detection apparatus received by the peripheral electrode 13 is supplied to the signal reception circuit 103 through the selector circuit 105, and the signal is demodulated in the signal reception mode. The demodulated reception signal is supplied to the control circuit 101. The control circuit 101 analyzes the reception signal from the position detection apparatus and determines the specifications of the position detection apparatus of the partner.

In the embodiment, the reception signal from the position detection apparatus includes information instructing the timing for the electronic pen body portion 1 to start transmitting the signal. Therefore, the control circuit 101 determines the switch timing from the signal reception mode to the signal transmission mode based on the information instructing the timing and performs a process, such as setting the timing for time division processing in the signal transmission mode. The control circuit 101 then switches the electronic pen body portion 1 from the signal reception mode to the signal transmission mode.

In the embodiment, a position detection period Ta for transmitting the burst signal for position detection and the pen pressure detection information toward the position detection apparatus and a tilt detection period Tb for detecting the tilt angle of the electronic pen 100 are performed in time division in the signal transmission mode as illustrated in FIG. 7B.

In the position detection period Ta, the control signal SW1 (see FIG. 7C) turns on the switch circuit 104, and the switch control signal SW2 connects the movable terminal M of the selector circuit 105 to the terminal G (see FIG. 7D). Therefore, the peripheral electrode 13 is connected to the earth electrode through the selector circuit 105 in the position detection period Ta. The control circuit 101 controls the signal transmission circuit 102 to output the burst signal of the position detection signal and the pen pressure information in the position detection period Ta. The position detection signal and the pen pressure information output from the signal transmission circuit 102 are supplied to the core body 15 through the switch circuit 104 and transmitted to the position detection sensor. In this case, the control circuit 101 controls the signal transmission circuit 102 to transmit the pen pressure information from the core body 15 after the end of the transmission period of the burst signal.

In this case, the peripheral electrode 13 is connected to the earth electrode, and the core body 15 is shielded except for a front end portion 15a that is the pen tip of the core body 15. Therefore, the signal from the signal transmission circuit 102 is transmitted from the front end portion 15a of the core body 15 without being affected by the outside.

In the tilt detection period Tb, the control signal SW1 (see FIG. 7C) turns off the switch circuit 104, and the switch control signal SW2 connects the movable terminal M of the selector circuit 105 to the terminal S (see FIG. 7D). In the tilt detection period Tb, the control circuit 101 controls the signal transmission circuit 102 to generate a burst signal for tilt detection. The burst signal for tilt detection is a signal with the same frequency as the burst signal of the position detection signal in the example.

Therefore, the burst signal for tilt detection from the signal transmission circuit 102 is supplied to the peripheral electrode 13 through the selector circuit 105 and transmitted to the position detection sensor in the tilt detection period Tb. The position detection apparatus that has received the burst signal for tilt detection through the position detection sensor detects the tilt angle of the electronic pen 100 as described later.

A detection method on the position detection apparatus side that detects the tilt angle of the electronic pen 100 according to the embodiment with the configuration and the function will be described. FIGS. 8A to 8F are diagrams for describing the detection of the tilt angle of the electronic pen 100 executed on the position detection apparatus side based on the signal from the electronic pen 100 of the embodiment.

Figure 8A:
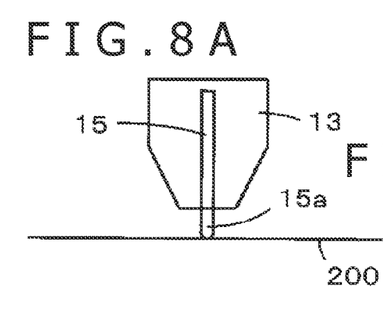
FIGS. 8A to 8F are diagrams for describing detection of a tilt angle of the electronic pen executed by the electronic pen according to an embodiment of the present disclosure.
Figure 8B:
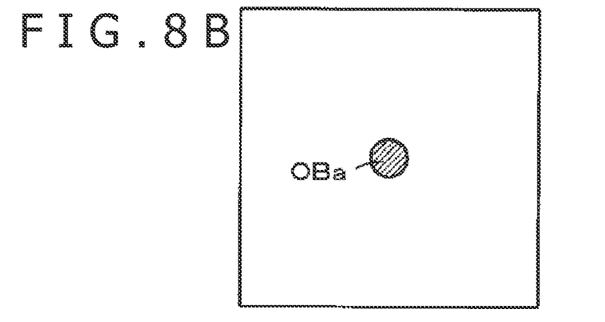
Figure 8C:
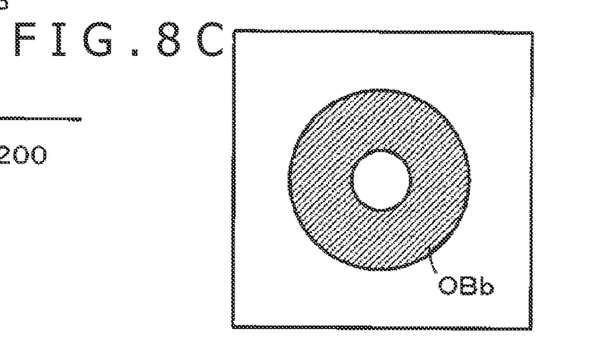

As illustrated in a schematic view of FIG. 8A, the front end portion 15a of the core body 15 and the position detection sensor 200 perform capacitive coupling in the position detection period Ta when the core body 15 of the electronic pen body portion 1 of the electronic pen 100 is perpendicular to an input surface of a position detection sensor 200. In this case, a region OBa of capacitive coupling is a region of perfect circle as illustrated in FIG. 8B. On the other hand, the peripheral electrode 13 and the position detection sensor 200 perform capacitive coupling in the tilt detection period Tb, and a region OBb of capacitive coupling is a ring-shaped region as illustrated in FIG. 8C.

Figures 8D, 8E, 8F:
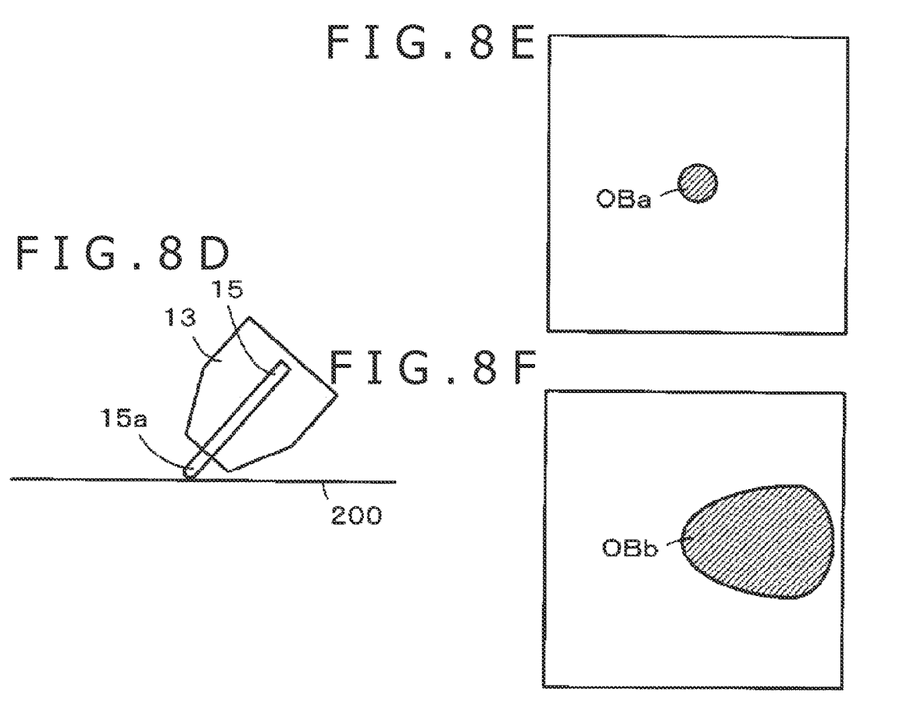

In the state illustrated in a schematic view of FIG. 8D, the core body 15 of the electronic pen body portion 1 of the electronic pen 100 is tilted with respect to the input surface of the position detection sensor 200. In this case, the region OBa of capacitive coupling between the front end portion 15a of the core body 15 and the position detection sensor 200 remains to be a region of substantially perfect circle in the position detection period Ta as illustrated in FIG. 8E. On the other hand, the region OBb of capacitive coupling between the peripheral electrode 13 and the position detection sensor 200 is an elliptical region corresponding to the tilt angle and elongated in the tilt direction in the tilt detection period Tb as illustrated in FIG. 8F.

Therefore, the control circuit of the position detection apparatus can detect the size of the tilt angle of the electronic pen 100 from the length in the oval direction of the elliptical shape of the region OBb illustrated in FIG. 8F. The control circuit can also detect the oval direction of the elliptical shape of the region OBb based on the instructed position of the electronic pen 100 illustrated in FIG. 8E to detect the tilt direction of the electronic pen 100.

Although a signal with the same frequency as the signal supplied to the core body 15 can be used for the peripheral electrode 13 that detects the tilt angle, the frequency of the signal supplied to the core body 15 and the frequency of the signal supplied to the peripheral electrode 13 may be different. In that case, the position detection apparatus can distinguish the signal from the core body 15 and the signal from the peripheral electrode 13.

Therefore, the electronic pen body portion 1 of the electronic pen 100 may be configured to transmit, to the position detection sensor 200, the signal from the core body 15 and the signal from the peripheral electrode 13 at the same time, instead of executing the position detection period Ta and the tilt detection period Tb in time division as described above. In this case, the position detection apparatus side can perform a process of detecting the instructed position of the electronic pen 100 and the tilt of the electronic pen 100 at the same time.

Note that, in the case of the electronic pen 100 according to the embodiment, not only the core body 15, but also the tapered portion 13a of the peripheral electrode 13 and the front cap 14 protrude from the tip of the electronic pen housing 2 as illustrated in FIG. 5. Therefore, not only the signal for position instruction, but also the signal for detecting the tilt angle of the electronic pen 100 can be more favorably transmitted to the position detection apparatus side through the tapered portion 13a of the peripheral electrode 13.

As illustrated in FIG. 6, the control circuit 101 and the connector portion 3 are electrically connected. This indicates that information, such as data and a program, can be transmitted and received to and from an external device through the connector portion 3. The control circuit 101 is, for example, what is generally called a microprocessor including a central processing unit (CPU), a read only memory (ROM), a random access memory (RAM), a non-volatile memory, and the like. In this case, the control circuit 101 can, for example, receive various types of setting information and the like from the external device, receive a program to be operated by the electronic pen, or provide the pen pressure information stored in the electronic pen 100 to the external device.

Effects of Embodiment

According to the electronic pen 100 of the embodiment, the electronic pen can be miniaturized by providing the connector portion on the connector housing 4 with a substantially triangular cross section. Conventionally, a connector housing with a circular cross section needed to be used to provide a contact portion on the diameter of the circular cross section. The electronic pen 100 is not bound by this configuration.

The axial center of the electronic pen 100 can be designed to go through the axial center of the electronic pen body portion 1 and go through the axial center of the connector substrate 31, from the front end (pen tip) of the core body 15 of the electronic pen 100 to the back end surface of the end cap 42. This can provide an electronic pen resistant to the pressure applied to the back end side from the pen tip direction and resistant to the pressure applied to the pen tip side from the back end side.

The axial centers of the core body 15 and the connector substrate can be positioned on the axial center of the electronic pen. Therefore, the connection configuration of the core body 15 part and the circuit board part of the electronic pen body portion 1 and the connection configuration of the connector substrate 31 and the circuit board part of the electronic pen body portion 1 do not become complicated. That is, even when the connector portion is provided, the excessive complication of the configuration can be prevented, compared to the conventional electronic pen.

Modifications

Although the peripheral electrode 13 is used to detect the tilt angle of the electronic pen 100 in the embodiment described above, the configuration is not limited to this. For example, the peripheral electrode 13 can be provided even in a case of an electronic pen that does not detect the tilt angle, and the peripheral electrode 13 can function as a shield electrode that prevents noise from entering the core body 15.

Although the cross section of the electronic pen housing 2 in the description is substantially triangular as in the connector housing 4, the cross section is not limited to this. The shape of the cross section of the electronic pen housing 2 may be any shape as long as the electronic pen body portion 1 can be housed. However, if the shape of the cross section of the electronic pen housing 2 matches the shape of the cross section of the connector housing 4 as in the embodiment, there is no difference in level on the side surface of the electronic pen also when the housings are connected.

Although the disclosure is applied to the AES type electronic pen in the example described in the embodiment, the application of the disclosure is not limited to this. For example, data or a program may need to be transmitted and received to increase the functionality even in a case of an Electro-Magnetic Resonance (EMR) type electronic pen. In addition, an EMR type electronic pen may also have, for example, a near field communication function of Bluetooth (registered trademark) standard. In such a case, a battery may be mounted to supply a power supply voltage, and the battery may need to be charged. In that case, the disclosure can also be applied to the EMR type electronic pen, and the connector portion can be provided at the back end portion of the electronic pen.

It is to be noted that the embodiment of the present disclosure is not limited to the foregoing embodiment, and that various changes can be made without departing from the spirit of the present disclosure.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic pen comprising:
an electronic pen body portion including a pipe portion in which a circuit board, an electronic circuit, and a conductive core body are housed;
an electronic pen housing that is a cylindrical body that houses the electronic pen body portion, wherein the conductive core body protrudes from an opening of the electronic pen housing;
a connector portion including a connector substrate, and a terminal portion including a base portion raised from the connector substrate in a direction crossing an axial direction of the connector substrate, and a contact portion extended to a back end side of the connector substrate from a position separated from the connector substrate on a back end surface of the base portion; and
a connector housing that is a cylindrical body that houses the connector portion and that is connected to a back end side of the electronic pen housing, in which a cross section of the connector housing in a direction orthogonal to the axial direction is substantially triangular,
wherein an axial center of the connector substrate coincides with an axial center of the electronic pen body portion when the connector housing in which the connector portion is housed is attached to the electronic pen housing in which the electronic pen body portion is housed.

2. The electronic pen according to claim 1, wherein a width of the connector substrate is equal to or smaller than a width of the connector portion.

3. The electronic pen according to claim 1, wherein an opening portion that is a socket of a plug to be connected to the terminal portion is provided on a back end surface of the connector housing, and part of the connector housing is formed from a metal material that provides a shell portion of the connector portion.

4. The electronic pen according to claim 1, wherein the connector portion is a charge terminal for charging a battery provided on the electronic pen body portion.

5. The electronic pen according to claim 1, wherein the connector portion is compliant with a universal serial bus standard.

6. The electronic pen according to claim 1, wherein:
the electronic pen body portion includes a signal generation circuit, and
the electronic pen is a capacitive type electronic pen that transmits a signal from the signal generation circuit to a position detection apparatus through the conductive core body.

7. The electronic pen according to claim 6, wherein a peripheral electrode is arranged around the conductive core body.

8. The electronic pen according to claim 7, wherein the peripheral electrode functions as a shield electrode for the conductive core body.

9. The electronic pen according to claim 7, wherein the peripheral electrode is an electrode for tilt detection of the electronic pen body portion.

10. The electronic pen according to claim 7, wherein the conductive core body of the electronic pen body portion and the peripheral electrode protrude from a pen tip side opening portion of the electronic pen housing.

11. The electronic pen according to claim 1, wherein:
a side switch is provided on a side surface of the electronic pen body portion, and
an operation portion for operating the side switch is provided on a side surface of the electronic pen housing in which the electronic pen body portion is housed, at a position corresponding to the side switch of the electronic pen body portion.

12. The electronic pen according to claim 1, wherein the contact portion of the terminal portion is formed in a region on a bottom side of the substantially triangular cross section of the connector housing.

* * * * *